United States Patent
Choi et al.

(10) Patent No.: US 7,930,620 B2
(45) Date of Patent: Apr. 19, 2011

(54) METHOD FOR UPDATING CHECK NODE IN LOW DENSITY PARITY CHECK DECODER

(75) Inventors: Eoi-young Choi, Seoul (KR); Jae-ho Roh, Seoul (KR); Young-chai Ko, Seoul (KR); Ki-hong Park, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1232 days.

(21) Appl. No.: 11/542,110

(22) Filed: Oct. 4, 2006

(65) Prior Publication Data

US 2007/0094568 A1    Apr. 26, 2007

(30) Foreign Application Priority Data

Oct. 7, 2005  (KR) .................. 10-2005-0094585

(51) Int. Cl.
*G06F 11/00*    (2006.01)
(52) U.S. Cl. ....................................... 714/800
(58) Field of Classification Search .................. 714/752, 714/786, 794–795, 800–801
See application file for complete search history.

(56) References Cited

U.S. PATENT DOCUMENTS

| | | | | |
|---|---|---|---|---|
| 7,107,511 B2* | 9/2006 | Shen et al. | .................... | 714/794 |
| 7,178,081 B2* | 2/2007 | Lee et al. | ...................... | 714/752 |
| 7,219,288 B2* | 5/2007 | Dielissen et al. | ............. | 714/752 |
| 7,475,103 B2* | 1/2009 | Novichkov et al. | ........... | 708/495 |
| 7,676,734 B2* | 3/2010 | Yamagishi | ..................... | 714/780 |
| 2008/0307292 A1* | 12/2008 | Gaudet et al. | ................. | 714/786 |

FOREIGN PATENT DOCUMENTS

EP    1819056 A1 *    8/2007

OTHER PUBLICATIONS

Howard et al., A degree matched check node approximation for LDPC decoding, 2005, IEEE, p. 1 to 5.*
Chen et al. Reduced complexity decoding of LDPC codes, Aug. 2005, IEEE, Trans on COmm., vol. 53, No. 8, p. 1288-1299.*
Xiao-Yu, Hu et al: "Efficient Implementations of the Sum-Product Algorithm for Decoding LDPC Codes", GlobeCom'01, 2001 IEEE Global Telecommunications Conference, San Antonio, TX, Nov. 25-29, 2001, IEEE Global Telecommunications Conference, New York, NY: IEEE, US, vol. 2 of 6, Nov. 25, 2001, pp. 1036-1036E, XP001099262, ISBN: 0-7803-7206-9.
Chen J. et al: "Near Optimal Reduced-Complexity Decoding Algorithms for LDPC Codes", Proceedings 2002 IEEE International Symposium on Information Theory, ISIT 02, Lausanne, Switzerland, Jun. 30-Jul. 5, 2002, IEEE International Symposium on Information Theory, New York, NY, IEEE, US, Jun. 30, 2002, p. 455, XP010602166, ISBN: 0-7803-7501-7.

(Continued)

*Primary Examiner* — Shelly A Chase
(74) *Attorney, Agent, or Firm* — Sughrue Mion, PLLC (57) ABSTRACT

A method is provided for updating a check node in a low density parity check (LDPC) decoder, including: transmitting log-likelihood ratio (LLR) messages from variable nodes to a plurality of check nodes; decomposing the LLR messages in a plurality of node messages for each check node; and updating each check node using a modified function $g(x)$, which is a function $g'(x)$ comprising a sum operation of exponential functions based on the node messages.

10 Claims, 6 Drawing Sheets

OTHER PUBLICATIONS

Bronstein, Semendjajew: "Taschenbuch der Mathematik", 1989, Harri Deutsch, XP002424060, p. 269-270.

Abramowitz and Stegun, "Handbook of Mathematical Functions", 1972, pp. 67-71.

M. Rodrigues et al., "Hardware evaluation of mathematical functions", IEEE Proc., vol. 128, Pt. E. No. 4 Jul. 1981 pp. 155-164.

S. Gal et al., "An accurate elementary mathematical library for the IEEE floating point standard" ACM Transactions on Mathematical Software, vol. 17, No. 1, Mar. 1991, pp. 26-45.

Communication from the European Patent Office dated Jun. 10, 2010, issued in counterpart European Application No. 06120895.5-1247.

* cited by examiner

METHOD FOR UPDATING CHECK NODE IN LOW DENSITY PARITY CHECK DECODER

CROSS-REFERENCE TO RELATED APPLICATIONS

This application claims priority from Korean Patent Application No. 10-2005-0094585 filed Oct. 7, 2005, in the Korean Intellectual Property Office, the disclosure of which is incorporated herein by reference.

BACKGROUND OF THE INVENTION

1. Field of the Invention

Methods consistent with the present invention relate to updating a check node in a low density parity check (LDPC) decoder and, more particularly, to a method for approximating a check node update rule to a sum of exponential functions. The method of the present invention lowers complexity of the check node update process and is comparable in performance to that of a belief propagation (BP) algorithm in digital communication systems that transmit high-speed data in order to update a check node in an LDPC decoder using the BP algorithm.

2. Description of the Related Art

Figure 1A:
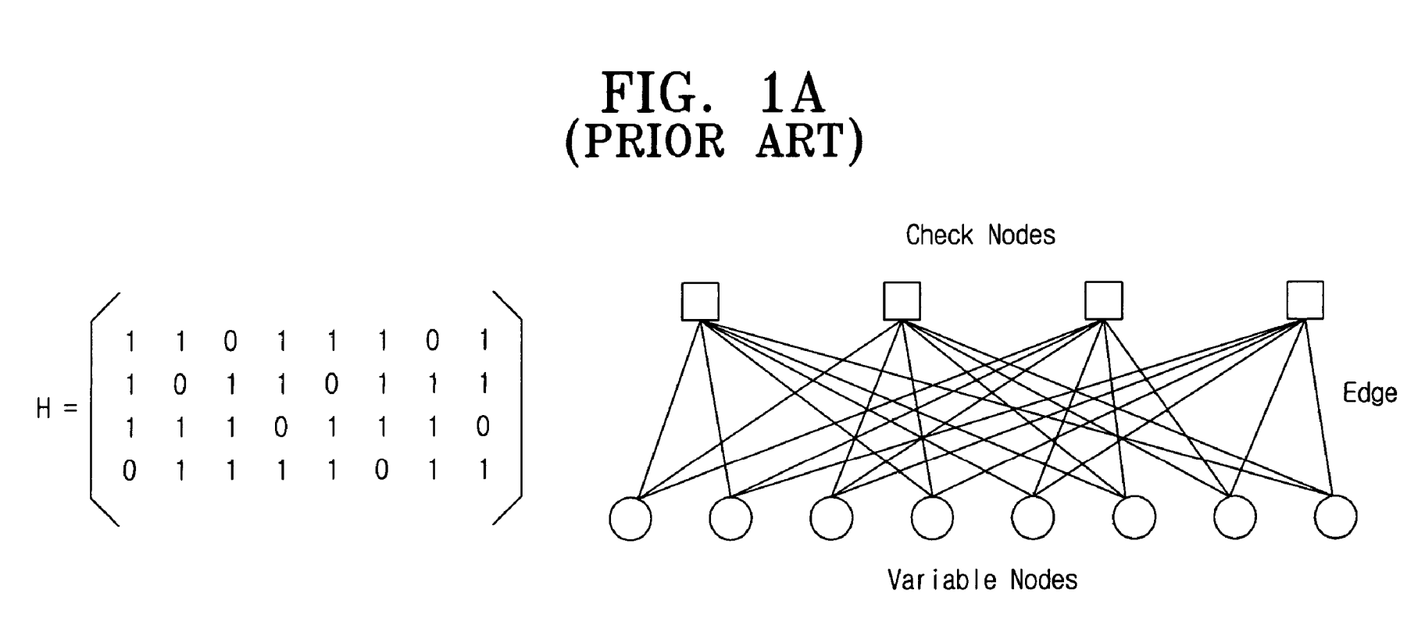
FIG. 1A is a view illustrating structures of a parity check matrix and its corresponding factor graph.

In general, a low density parity check (LDPC) code is defined by a parity check matrix having a very small number of "1s" in each row and in each column as shown in FIG. 1A, and the LDPC code can be represented by a "factor graph," which includes check nodes, variable nodes and edges.

An LDPC code can be decoded using a belief propagation (BP) algorithm, which enables accurate and complete parallel decoding of even very long codewords. Accordingly, the processing speed of the BP algorithm can be high. An LDPC decoder based on a BP algorithm is a soft decision decoder which is based on likelihood from channel output, and the BP algorithm shows a higher performance than a bounded distance decoder. Because an LDPC with the BP algorithm is a good decoder, LDPC codes with large block sizes are practical for implementation. LDPC codes with large block sizes are advantageous because they show a capability to approach the Shannon-limit and have a large minimum distance. Thus, the detection error, which appears in turbo codes with small minimum distances, hardly shows in the LDPC codes with large block sizes.

For LDPC codes, a parity check matrix H provides the structure for the decoding algorithm. As shown in FIG. 1A, there is an edge in the graph connecting the variable and check nodes exactly when there is a "1" in the matrix H. Accordingly, an association can be made between edge and the non-zero entries of the matrix H. This graph, which is called a "factor graph," completely describes all the relations of the codes and can be used for decoding by using a BP algorithm. Starting with the input consisting of messages for the variable nodes, the BP algorithm uses the parity-check relationships among the bits in order to iteratively update and pass messages between the variable nodes and check nodes. Two steps, one updating of all the check nodes and one updating of all the variable nodes, comprise a single iteration. With a binary communication system, a message is expressed using a log-likelihood ratio (LLR) as in Equation 1:

$$LLR(x) = \log \frac{P(x=1)}{P(x=0)} \quad (1)$$

In this case, because the variable node update rule is formed using an algorithm with only summing operations. Thus, the values can be easily realized. However, the check node update rule includes a hyperbolic tangent function and many multiplication operations. Accordingly, the BP algorithm used in the check node update rule is a Sum-Product algorithm and the values cannot be easily realized.

Figure 1B:
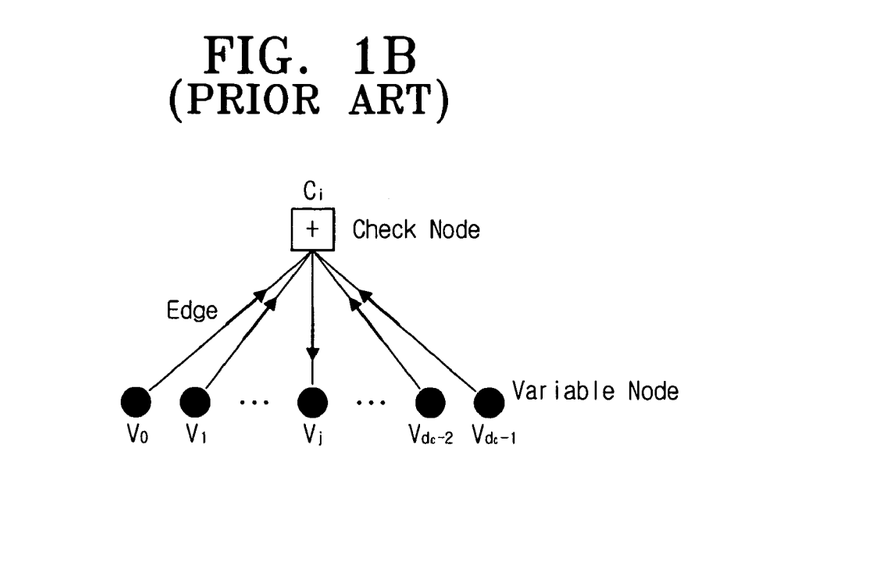
FIG. 1B is a view illustrating a process of updating a message from a check node to a variable node in a BP algorithm.

FIG. 1B describes the process of updating a message, LLR $(\lambda_{c_i \to v_j})$, from a check node $C_i$ to a variable node $V_j$. If $d_c$ represents the number of variable nodes, LLR$(\lambda_{c_i \to v_j})$ is updated by the rule expressed in Equation 2 using messages from $(d_c-1)$ variable nodes $V_0, V_1, \sim V_{d_c-2}$, and $V_{d_c-1}$ (except $V_j$) connected to a check node $C_i$.

$$LLR(\lambda_{c_i \to v_j}) = (-1)^{d_c} \cdot 2\tanh^{-1}\left(\prod_{j' \in N(c_i)\backslash j} \tanh\left(\frac{1}{2}(LLR\lambda_{v_{j'} \to c_i})\right)\right) \quad (2)$$

As shown in FIG. 1B, messages on the edges from a check node $C_i$ to each of the $d_c$ variable nodes $V_0, V_1, \sim V_{d_c-2}$ must be updated. Thus, Equation 2 is executed $d_c$ times for each check node, which means that $d_c \times (d_c-1)$ operations are required for one check node.

Figure 1C:
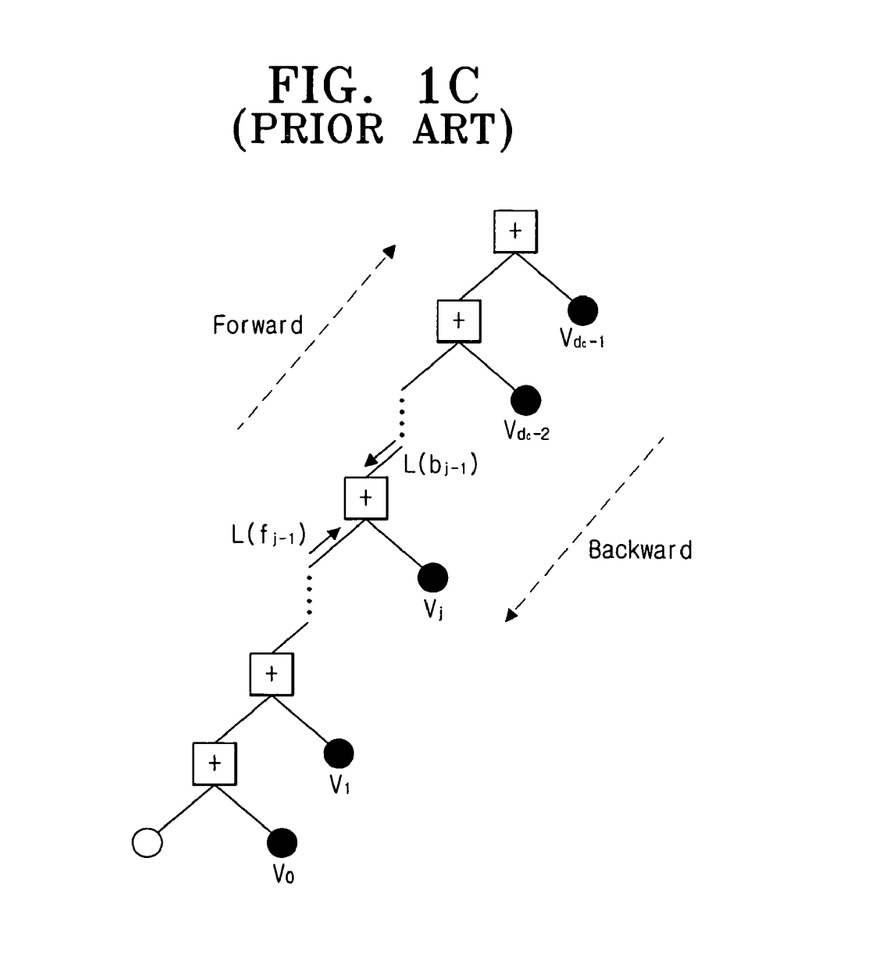
FIG. 1C is a view illustrating a process of updating from a check node to a variable node by decomposing the edge messages into a plurality of node messages in a BP algorithm.

Alternatively, the messages on the edges from a check node $C_i$ to each of the $d_c$ variable nodes $V_0, V_1, \sim V_{d_c-2}$ may be updated by decomposing the messages into $d_c$ messages for each check node as shown in FIG. 1C. The messages are updated by executing the function shown in Equation 3. The method in FIG. 1C requires a smaller number of operations than the method in FIG. 1B.

$$LLR(\lambda_{c_i => v_j}) = (-1)^{d_c} \cdot L(f_{j-1} + b_{j+1}) \quad (3)$$

$$= (-1)^{d_c} \cdot \left[\log \frac{1 + e^{L(f_{j+1} + b_{j+1})}}{e^{L(f_{j-1})} + e^{L(b_{j+1})}}\right]$$

$$= (-1)^{d_c} \cdot [\text{sign }[L(f_{j-1}) \cdot \text{sign}(L(b_{j+1}) \cdot$$
$$\min(|L(f_{j-1})|, |L(b_{j+1})|)$$
$$\underbrace{-g(L(f_{j-1}) \cdot L(b_{j+1}))}_{(A)} + \underbrace{g(L(f_{j-1}) \cdot L(b_{j+1}))}_{(B)}\Big].$$

An update value of each edge message for the check node shown in FIG. 1C can be expressed with Sign-Min function and a function g(x) shown in (A) and (B) of Equation 3. Here, the function (g)x may be expressed as in Equation 4:

$$g(x) = \log(1 + e^{-|x|}) \quad (4)$$

Although the check node updating method of FIG. 1C using Equation 3 requires a smaller number of operations than the BP algorithm, it still includes the function g(x) that is difficult to implement.

Thus, several methods for easily implementing the function g(x) have been proposed. The Sign-Min method assumes g(x)=0 and takes only sign and minimum values of two input values to compute Equation 3 easily. The Normalize-BP algorithm sets g(x) to some constant value that is larger than "1" to revise the Sign-Min method. However, these methods have poor performance when compared to the existing BP algorithm.

The quantization method, linear approximation method, piecewise linear approximation method, and the like are examples of methods of approximating g(x) to g'(x) in order to easily realize g(x). The piecewise linear approximation method has a higher performance than existing methods and thus, shows a performance similar to that of the BP algorithm. However, the piecewise linear approximation method uses different functions at different intervals and requires a lookup table.

SUMMARY OF THE INVENTION

Exemplary embodiments of the present invention overcome the above disadvantages and other disadvantages not described above. Also, the present invention is not required to overcome the disadvantages described above, and an exemplary embodiment of the present invention may not overcome any of the problems described above. The present invention provides a method for approximating a check node update rule to a sum of exponent functions in order to lower the complexity of the update operation. Another object of the present invention is to make the update operation comparable in performance to that of a belief propagation (BP) algorithm in a digital communication system that transmits high speed data in order to update a check node in a low density parity check (LDPC) decoder using the BP algorithm.

According to an aspect of the present invention, a method for updating a check node in the LDPC decoder includes transmitting LLR (log-likelihood ratio) messages from variable nodes to a plurality of check nodes; decomposing the LLR messages into a plurality of node messages for each check node; and updating each check node using a function comprising a function g'(x) that is an approximated exponential function based on a node message.

Preferably, but not necessarily, the function g'(x) may include a sum of three exponential terms, i.e., first, second, and third exponential terms, and may be expressed as $$g'(x) = e^{-|x|} - \frac{e^{-2|x|}}{2} + 2^{-\alpha},$$

where $e^{-|x|}$ is the first exponential term, $$\frac{e^{-2|x|}}{2}$$

is the second exponential term, and $2^{-\alpha}$ is the third exponential term. The second and third exponential terms are optional.

If the third exponential term is used, $\alpha$ may be selected based on performance. The exponential functions given above may also be represented by exponential functions in base 2.

The base 2 exponential functions may be expressed as $g'(x)=2^{-(|x|log_2 e+1)}-2^{-(2|x|log_2 e+1)}+2^{-\alpha}$, which comprises the first, second and third terms. However, an embodiment consistent with the present invention may include only the first term, with each of the second and third terms being optional.

BRIEF DESCRIPTION OF THE DRAWINGS

The above and other aspects of the present invention will be more apparent by describing certain exemplary embodiments of the present invention with reference to the accompanying drawings, in which.

DETAILED DESCRIPTION OF EXEMPLARY EMBODIMENTS

Reference will now be made in detail to exemplary embodiments of the present invention, examples of which are illustrated in the accompanying drawings, wherein like reference numerals refer to the like elements throughout. The exemplary embodiments are described below in order to explain the present invention by referring to the figures.

The matters defined in the description such as the detailed construction and elements are provided to assist in a comprehensive understanding of the invention. Thus, it would be apparent to one skilled in the art that the present invention can be practiced out without those defined matters. Also, well-known functions or constructions are not described in detail since they would obscure the invention with unnecessary detail.

Figure 2:
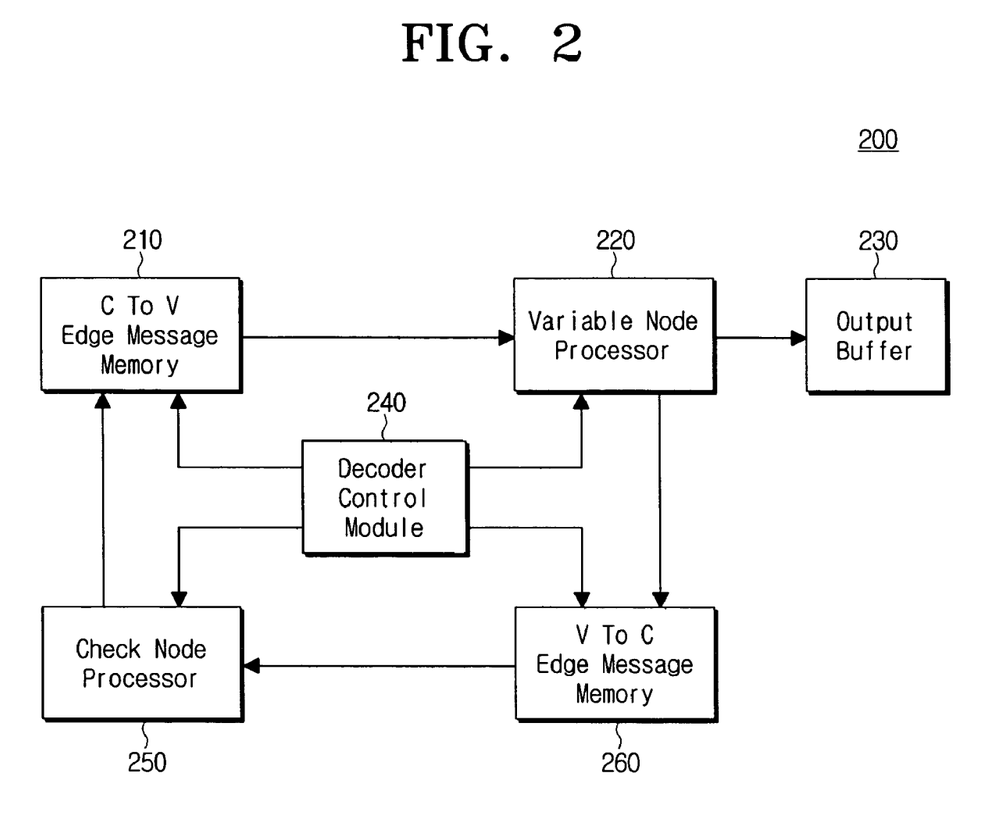
FIG. 2 is a block diagram of a low density parity check (LDPC) decoder according to an embodiment of the present invention.

FIG. 2 is a block diagram of a low density parity check (LDPC) decoder according to an exemplary embodiment of the present invention.

As shown in FIG. 2, an LDPC decoder 200 includes a check node (C) to variable node (V) edge message memory 210, a variable node processor 220, an output buffer 230, a decoder control module 240, a check node processor 250, and a V to C edge message memory 260.

The LDPC decoder 200 calculates a probability of each bit of a code language received through each edge being "0" or "1." Information with respect to the probability calculated by the LDPC decoder 200 is called a message. The quality of the message can be checked through each parity defined in a parity check matrix.

Here, the C to V edge message memory 210 stores messages transmitted from checks node to variable nodes through edges, and the V to C edge message memory 260 stores messages transmitted from the variable nodes to the check nodes through the edges.

The variable nodes receive LLR values of input coded symbols, and the variable node processor 220 updates the LLR values received through the variable nodes according to a variable node update rule and transmits the updated LLR values to the check nodes. The check node processor 250 updates the LLR values from the variable nodes by the method shown in FIG. 1C and a modified Equation 3 where the function g(x) is replaced with a function g'(x) comprised of a sum operation of exponential functions. The check node processor 250 then transmits the result of the operation to the variable nodes.

The output buffer 230 temporarily stores the coded symbols of the variable nodes.

The decoder control module 240 controls the processors including the variable node processor 220 and the check node processor 250 to repeatedly update the messages.

A function used for updating the check nodes may be obtained by replacing the log function g(x) of Equation 4 with an exponential function shown in Equation 5 according to Taylor's theorem. Preferably, but not necessarily, an approximation of Equation 5 is then derived by replacing the third and higher terms in the exponential series with $2^{-\alpha}$. The approximated function g'(x) is in Equation 6. As described above, Equation 6 can also be represented by an exponential function in base 2 as shown in Equation 7. The exponent a in Equations 6 and 7 may be replaced with "4|x|+2", which provides a performance that is comparable to the original BP algorithm. Equation 7 can be conveniently implemented by using only shift registers. Although the first exponential term in the function g'(x) must be used, the second and third exponential terms are optional and used if necessary. Thus, the function of the present invention used for updating check nodes is obtained by approximating the function g(x) as shown in Equation 3 to an exponential function and includes only a sum of exponential functions as shown in Equations 6 and 7.

$$g'(x) = e^{-|x|} - \frac{e^{-2|x|}}{2} + \frac{e^{-3|x|}}{3} - \frac{e^{-4|x|}}{2} + \cdots . \quad (5)$$

$$g'(x) = e^{-|x|} - \frac{e^{-2|x|}}{2} + 2^{-\alpha} \quad (6)$$

$$g'(x) = 2^{-(|x|\log_2 e)} - 2^{-(2|x|\log_2 e+1)} + 2^{-\alpha} \quad (7)$$

Figure 3:
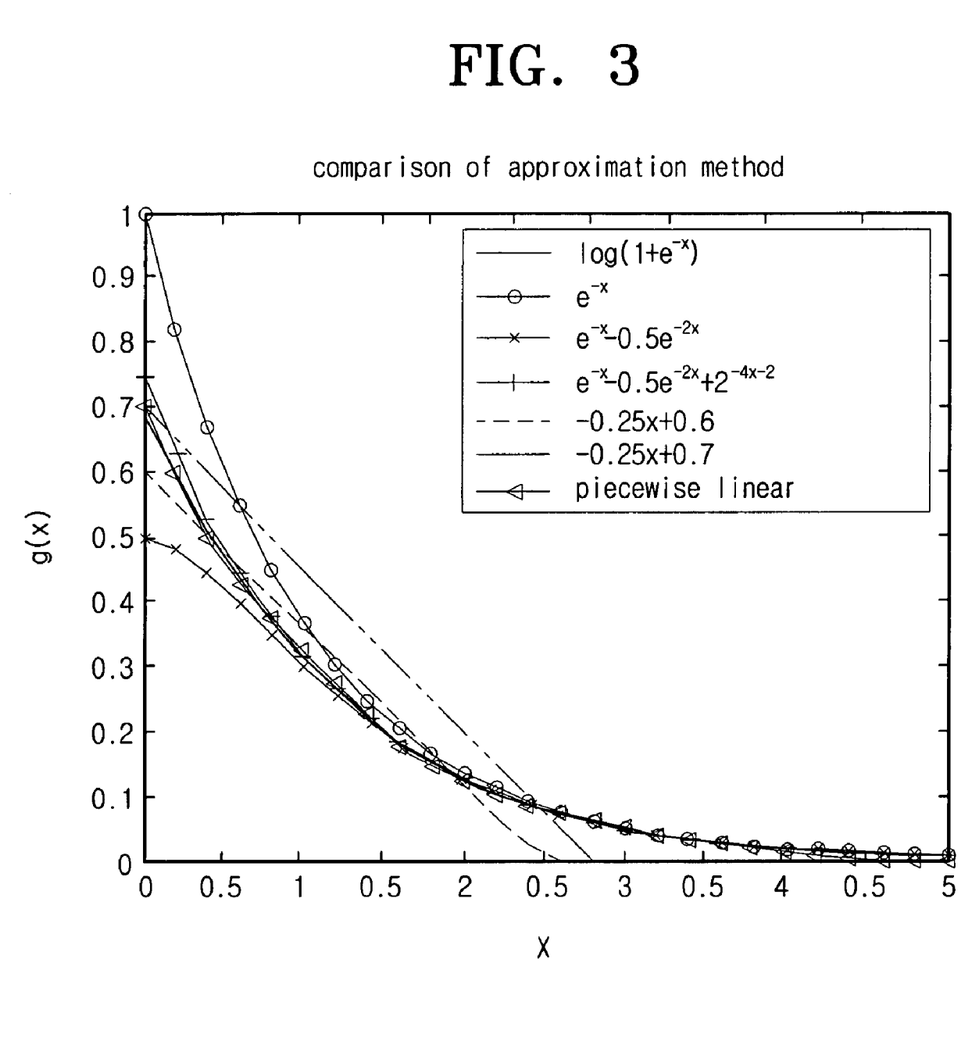
FIG. 3 is a graph illustrating results of the experiments performed on various g'(x) functions applied to an update of a check node including embodiments consistent with the present invention.

FIG. 3 is a graph illustrating results of the experiments performed on various approximation functions, g'(x), applied to an update of a check node and includes exemplary embodiments of the present invention. FIG. 3 provides a graphical comparison between the approximation exponential functions consistent with exemplary embodiments of the present invention and an original function g(x). The approximation functions include a function using the first term, a function using the first and second terms and a function using the first, second and third terms.

Figure 4:
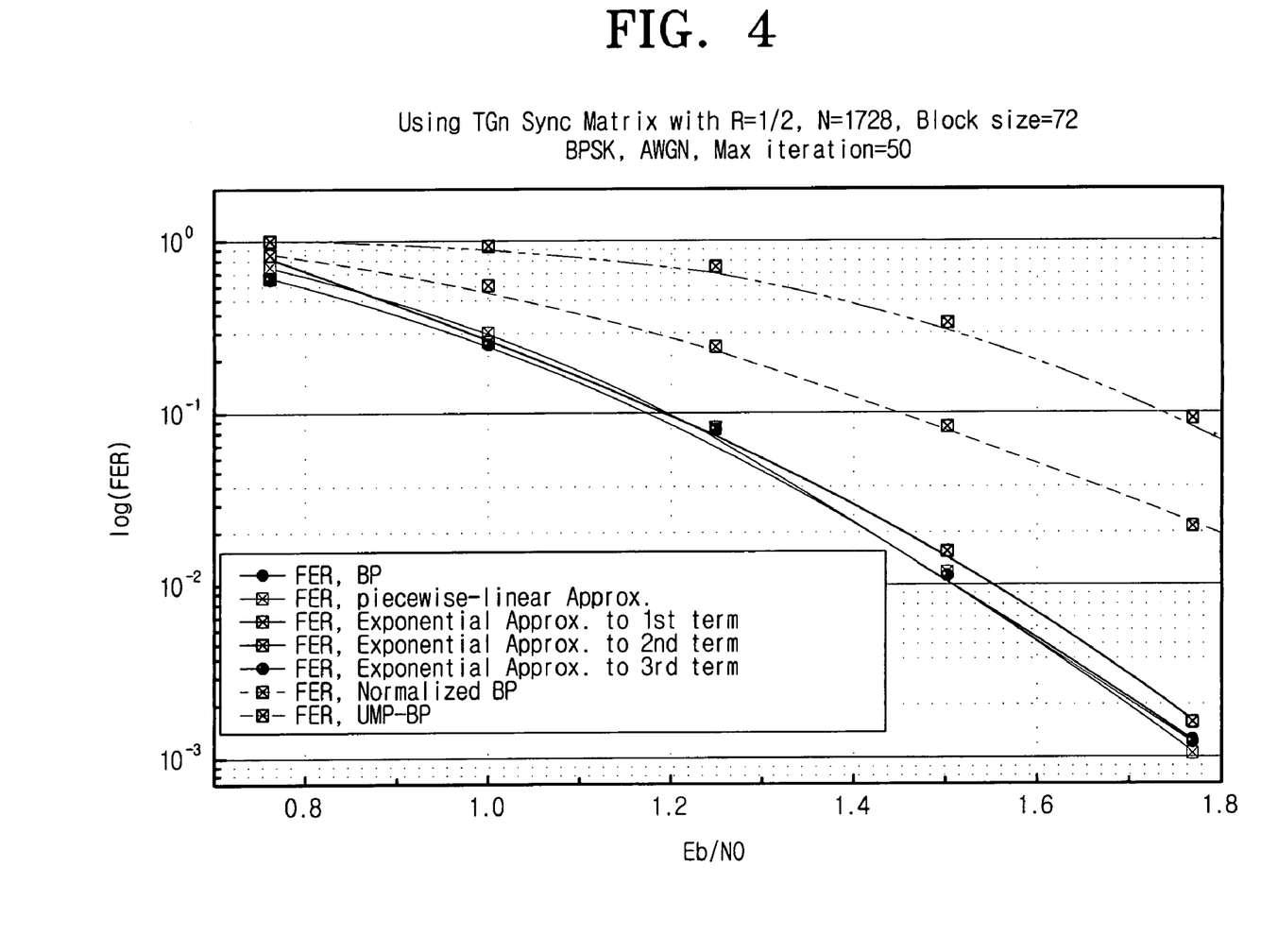
FIG. 4 is a graph illustrating frame error rates (FERs) by several different check node update rules including embodiments consistent with the present invention.
Figure 5:
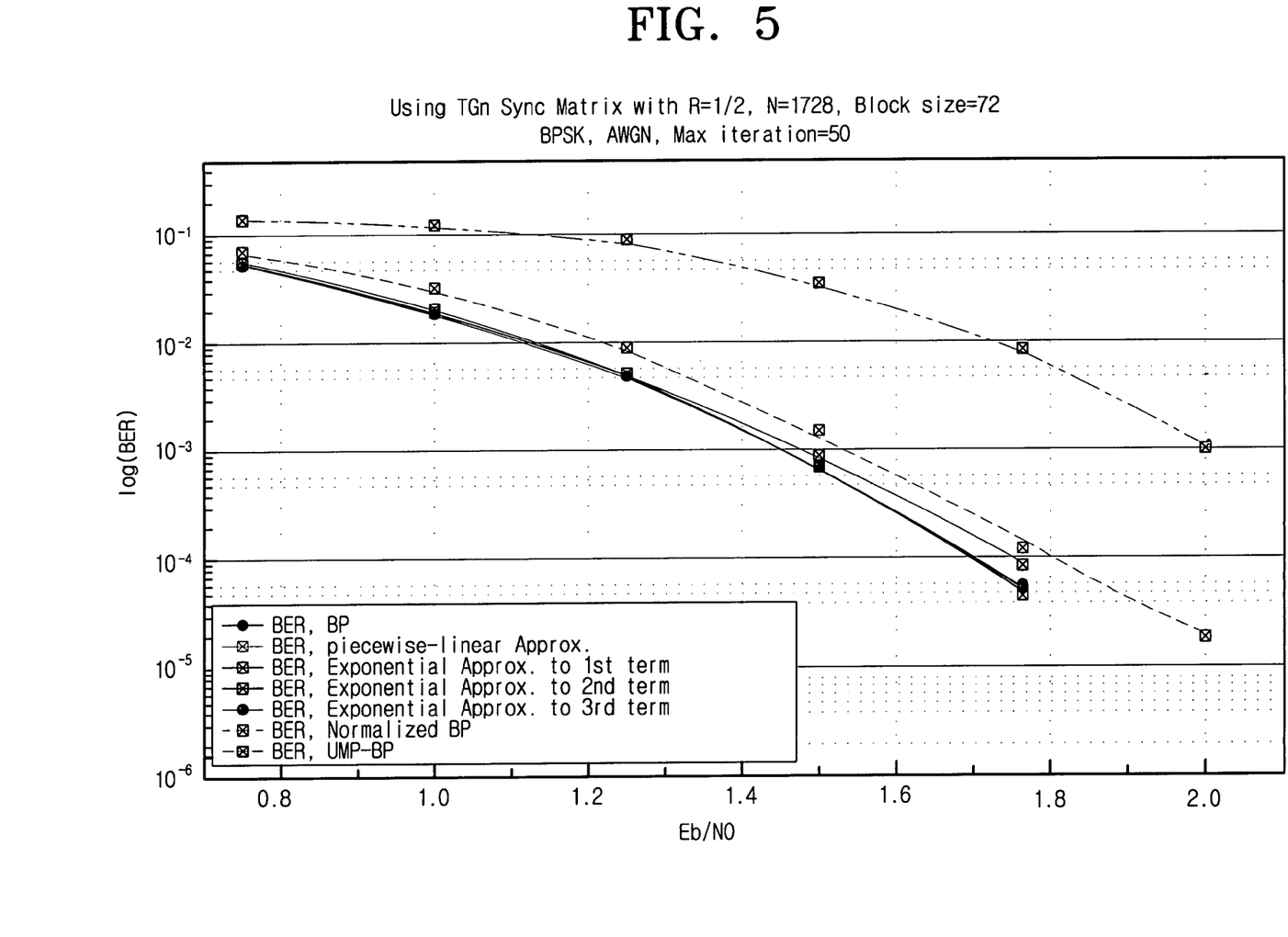
FIG. 5 is a graph illustrating bit error rates (BER) by several different check node update rules including embodiments consistent with the present invention.

FIG. 4 is a graph illustrating frame error rates (FERs) by several different check node update rules and includes exemplary embodiments of the present invention, and FIG. 5 is a graph illustrating bit error rates (BER) by several different check node update rules and includes embodiments of the present invention.

The results of the experiments shown in FIGS. 4 and 5 were obtained using the specification, "11-04-0889-05-000n-tgn-sync-proposal-technical-specification.doc," that was adopted by TGn Sync, an IEEE 802.11n technology group. A code rate R of ½, a codeword size of 1728, a block size of 72, an Additive White Gaussian Noise (AWGN) and Binary Phase Shift Key (BPSK) were used in deriving the graphs illustrated in FIGS. 4 and 5. FIG. 4 shows FERs of a BP, piecewise linear approximation, exponential approximations consistent with the present invention to first, second, and third terms of an update function, a Normalized BP, and a UMP-BP. The FER results of the exemplary embodiments of the exponential approximations using the first, second, and third terms of the update function are almost equal to the performance result value of the BP algorithm. Similarly, the BER results of the exemplary embodiments of the exponential approximations using the first, second, and third terms of the update function are also almost equal to the performance result value of the BP algorithm.

As described above, consistent with the present invention, a rule used for updating a check node can consist of sums of exponential functions and thus, can be easily realized using an adder and a shift register. Also, one equation can be used for all intervals. Therefore, a look-up table is not additionally required. In addition, there is little performance deterioration from a case where an existing BP algorithm is used.

The foregoing embodiments and advantages are merely exemplary and are not to be construed as limiting the present invention. The present teaching can be readily applied to other types of apparatuses. Also, the description of the embodiments of the present invention is intended to be illustrative, and not to limit the scope of the claims, and many alternatives, modifications, and variations will be apparent to those skilled in the art.

What is claimed is:

1. A method for updating a check node in a low density parity check (LDPC) decoder, comprising:
    transmitting log-likelihood ratio (LLR) messages from variable nodes to a plurality of check nodes;
    decomposing the LLR messages into a plurality of node messages for each check node; and
    updating each check node using a function comprising a function g'(x) that is an approximated exponential function based on a node message,
    wherein the function g'(x) comprises a sum of a first exponential term and a second exponential term.

2. The method of claim 1, wherein the function g'(x) comprises a sum of the first exponential term, the second exponential term and a third exponential term.

3. The method of claim 2, wherein the function g'(x) is expressed as:

$$g'(x) = e^{-|x|} - \frac{e^{-2|x|}}{2} + 2^{-\alpha}.$$

4. The method of claim 3, wherein $\alpha$ is selected based on performance of a belief propagation algorithm.

5. The method of claim 3, wherein $\alpha$ is 4|x|+2.

6. The method of claim 1, wherein the function g'(x) is expressed as:

$$g'(x) = e^{-|x|} - \frac{e^{-2|x|}}{2}.$$

7. The method of claim 1, wherein the approximated exponential function comprises an exponential function in base 2.

8. The method of claim 7, wherein the exponential in base 2 is expressed by an Equation which is expressed as:

$$g'(x) = 2^{-(|x|\log_2 e)} - 2^{-(2|x|\log_2 e+1)} + 2^{-\alpha}.$$

9. The method of claim 8, wherein $\alpha$ is 4|x|+2.

10. A method for updating a check node in a low density parity check (LDPC) decoder, comprising:
    transmitting log-likelihood ratio (LLR) messages from variable nodes to a plurality of check nodes;
    decomposing the LLR messages into a plurality of node messages for each check node; and
    updating each check node using a function comprising a function g'(x) that is an approximated exponential function based on a node message, wherein the function g'(x) is expressed as:

$$g'(x) = e^{-|x|}.$$

* * * * *